US008200171B1

(12) United States Patent
Husted

(10) Patent No.: US 8,200,171 B1
(45) Date of Patent: Jun. 12, 2012

(54) SQUARE WAVE TESTING OF TWO-POINT POLAR AMPLIFIERS

(75) Inventor: Paul J. Husted, San Jose, CA (US)

(73) Assignee: Qualcomm Atheros, Inc., San Jose, CA (US)

( * ) Notice: Subject to any disclaimer, the term of this patent is extended or adjusted under 35 U.S.C. 154(b) by 1041 days.

(21) Appl. No.: 12/126,848

(22) Filed: May 23, 2008

Related U.S. Application Data

(60) Provisional application No. 60/940,958, filed on May 30, 2007.

(51) Int. Cl.
*H04B 17/00* (2006.01)
*H03C 1/62* (2006.01)
(52) U.S. Cl. ............... 455/115.1; 455/115.2; 455/67.11; 455/67.14; 455/108; 455/110
(58) Field of Classification Search ............... 455/67.11, 455/67.14, 115.1, 115.2, 102, 108, 110, 114.3
See application file for complete search history.

(56) References Cited

U.S. PATENT DOCUMENTS

| 3,864,523 | A * | 2/1975 | Kellermann | 370/242 |
|---|---|---|---|---|
| 5,204,881 | A * | 4/1993 | Cardini et al. | 375/297 |
| 5,507,015 | A * | 4/1996 | Karczewski et al. | 455/116 |
| 5,978,661 | A * | 11/1999 | Caspers et al. | 455/110 |
| 6,118,975 | A * | 9/2000 | Bowyer et al. | 725/107 |
| 7,082,290 | B2 * | 7/2006 | Takano et al. | 455/102 |
| 7,133,649 | B2 * | 11/2006 | Kanazawa et al. | 455/91 |
| 7,409,194 | B2 * | 8/2008 | Shi et al. | 455/126 |
| 7,630,700 | B2 * | 12/2009 | Vaisanen | 455/313 |
| 7,778,352 | B2 * | 8/2010 | Jensen et al. | 375/297 |
| 7,817,970 | B2 * | 10/2010 | Puma | 455/114.3 |
| 2006/0178120 | A1 * | 8/2006 | Puma | 455/114.3 |

* cited by examiner

*Primary Examiner* — Duc M Nguyen
(74) *Attorney, Agent, or Firm* — Bever, Hoffman & Harms, LLP

(57) ABSTRACT

A method and apparatus for testing a polar transmitter uses at least one square wave waveform as test stimuli replacing a multitone waveform. Each square wave signal is coupled one at a time to a frequency modulating input of the polar transmitter. The output of the polar transmitter is analyzed by observing the amplitude and frequency of the demodulated components corresponding to each square wave signal.

3 Claims, 6 Drawing Sheets

US 8,200,171 B1

SQUARE WAVE TESTING OF TWO-POINT POLAR AMPLIFIERS

RELATED APPLICATION

This application claims priority of U.S. Provisional Patent Application 60/940,958, entitled "Square Wave Testing Of Two-Point Polar Amplifiers" filed May 30, 2007.

BACKGROUND OF THE INVENTION

1. Field of the Invention

Embodiments of the specification generally relate to wireless communications and more particularly to the use of square wave waveforms for testing two-point polar amplifiers.

2. Description of the Related Art

Wireless communications systems generally use radio frequency (RF) signals to transmit data from a transmitter to one or more receivers. Wireless communication systems are frequently used to implement wireless local area networks (LANs) in which data is transmitted and received between computers, servers, Ethernet switches, hubs and the like. A wireless LAN may, for example, enable web page data to be transferred between a server and a computer.

Wireless communication systems often transmit data through transmitters using traditional heterodyne architectures. These architectures typically involve the creation of Cartesian (I and Q) waveforms and then up-mixing the waveforms to a desired frequency. Heterodyne architectures, unfortunately, may require many processing units to handle the Cartesian waveforms, such as a plurality of low-pass filters, baseband amplifiers, mixers and a linear RF amplifier.

Polar transmission architectures may reduce the size and power consumption of a transmitter by, among other things, removing one or more up-mixing stages from the transmitter. Polar transmitters are typically configured to transmit data based upon amplitude and phase waveforms rather than Cartesian I and Q waveforms. One example of a polar transmitter is a two-point polar transmitter in which the phase waveform may be derived from modulating frequency data that is coupled into two frequency inputs. Often, a first modulating frequency input affects the high frequency content of the modulated output and a second modulating frequency input affects the low frequency content of the modulated output of the polar transmitter. A two-point polar transmitter may have relatively greater frequency modulation range than single-point polar transmitters, which may be advantageous when such transmitters are used to transmit relatively greater bandwidth Bluetooth™ waveforms such as the two and three Mbs phase shift keying (PSK) waveforms which may be specified by Bluetooth™ Specification v2.0.

Two-point polar transmitters may be more difficult to test compared to conventional heterodyne transmitters. The fidelity of a transmitted output may depend on the processing of the modulating frequency data within the two-point polar transmitter. Typically, there are separate data processing paths for the first and second modulating frequency inputs. The separate data processing paths may include relatively different processing steps which may lead to a data alignment problem within the two-point polar transmitter. When the data is poorly aligned, the two-point polar transmitter may not optimally transmit the modulated signal.

The data processing within the separate data processing paths may be adjusted in such a manner to compensate for any data alignment issues so that the resulting transmitted signal may have relatively good fidelity (i.e., the transmitted output may include relatively low amounts of distortion). For example, the gain and delay characteristics of the data processing path related to the first modulating frequency input may require some adjustment to more optimally align the processed data with the processed data related to the second modulating frequency input.

One well-known technique for testing the transmitted output of two-point polar transmitters uses a multitone signal. A multitone signal may include two or more simultaneous sinusoidal frequencies. FIG. 1 is a graph of a typical multitone signal 100 that includes three simultaneous frequencies. In one embodiment, the multitone signal may include a first sinusoidal waveform with a frequency F1 and may also include additional sinusoidal waveforms in which the frequency of the additional signals is related to the first sinusoidal signal by an integer. For example, the second sinusoidal waveform may have frequency 2*F1, the third sinusoidal waveform may have frequency 3*F1 and so on. In other embodiments, the multitone signal may include two or more simultaneous sinusoidal frequencies not related by integers. Typically, the amplitudes of each of the simultaneous sinusoids are approximately equal in order to ease the analysis of the FM demodulated output of the two-point polar transmitter. The output of a two-point polar transmitter may be tested by coupling the multitone signal to the two modulating frequency inputs and analyzing the output of the transmitter as is described in greater detail below.

FIG. 2 is a block diagram of a prior art two-point polar transmitter hereinafter referred to as the polar transmitter 200. The polar transmitter 200 includes a polar amplifier 201, a voltage controlled oscillator (VCO) 202, a high frequency processing block 203 a low frequency processing block 204, and a summing node 205. Modulating frequency data is coupled to the polar transmitter 200 through the modulating frequency data input. Within the polar transmitter 200, the modulating frequency is coupled to the high frequency processing block 203 and the low frequency processing block 204. Within the high frequency processing block 203, the modulating frequency data undergoes processing that may affect the high frequency modulated content of the output of the polar transmitter 200. The output of the high frequency processing block 203 is coupled to a first input of the VCO 202. In contrast to the high frequency processing block 203, the modulating frequency data coupled to the low frequency processing block 204 undergoes processing that may affect the low frequency modulated content of the output of the polar transmitter 200. The output of the low frequency processing block 204 is coupled to a first input of the summing node 205 while carrier frequency data is coupled to a second input of the summing node 205. The output of the summing node 205 is coupled to a second input of the VCO 202. The polar amplifier 201 includes frequency and amplitude inputs. The output of the VCO 202 is a modulated sinusoid that is coupled to the frequency input of the polar amplifier 201 while amplitude data is coupled to the amplitude input of the polar amplifier 201. Note that some VCOs may be implemented as closed loop systems, which may be more accurately tested in such a configuration. The output of the polar amplifier 201 is the output of the polar transmitter 200.

Both the high frequency processing block 202 and the low frequency processing block 204 may include gain and delay processing elements that may non-optimally align the processed modulating frequency data coupled to the VCO 202. As described above, the gain and the delay of the high frequency processing block 202 and the low frequency processing block 204 may be adjusted to minimize distortion of the transmitted signal. One method for testing polar transmitters replaces the modulating frequency data with a multitone signal and analyzes the demodulated FM output. In one embodiment, the multitone signal may replace the modulating frequency data through a signal selector (mux) 206 as shown in FIG. 2. Since the polar transmitter frequency modulates each sinusoidal frequency included in the multitone signal, the demodulated output of the polar transmitter 200 should include an output component corresponding to the frequency of each modulated sinusoid. When the amplitudes of the sinusoids included in the multitone signal are substantially the same, the output components of each frequency (FM) demodulated sinusoid from the multitone signal should also have relatively the same amplitude and appear at the correct corresponding frequencies when the processed modulating frequency data is relatively optimally aligned. If the processed modulating frequency data is non-optimally aligned, then the amplitudes of the demodulated sinusoids may vary and, furthermore, the demodulated sinusoids may be displaced from the correct corresponding frequencies (described in greater detail below in the description of FIG. 3).

FIG. 3 is a graph of the FM demodulated output 300 of the polar transmitter modulating a multitone signal. As described above, the multitone signal may replace the modulating frequency data and is selectively coupled to the modulating frequency data input of the polar transmitter. In one example, the multitone signal may include six or more simultaneous sinusoids, however, only the first five are considered herein for illustration purposes. Furthermore, in this example the amplitudes of the sinusoids included in the multitone signal are substantially the same. The first sinusoid has a frequency of F1 Hz. The second sinusoid has a frequency of F2 Hz, the third sinusoid has a frequency of F3 Hz, the fourth sinusoid has a frequency of F4 Hz, and the fifth sinusoid has a frequency of F5 Hz. The output of the polar transmitter is FM demodulated. If the gain and delay of the low and high frequency processing blocks are relatively well aligned, then the amplitude of each FM demodulated component corresponding to a frequency within the multitone signal should be substantially the same because the amplitudes of the sinusoids included in the multitone signal are substantially the same. FIG. 3 shows the FM demodulated output of the polar transmitter with five output components corresponding to five sinusoidal frequencies within the multitone signal. As shown, each output component has approximately the same amplitude and the components appear at frequencies corresponding to the sinusoid frequencies in the multitone signal. If one or more of the output components are higher or lower in amplitude than what may be expected, then the gain or delay of the processing within the high or low frequency blocks may not be optimal. One or more of the output components not appearing at the frequencies corresponding to the sinusoids in the multitone signal may also indicate a sub-optimal gain or delay.

Although the multitone signal may be useful for testing polar transmitters, there are some disadvantages associated with generating and using the multitone signal. Typically, the multitone signal may be generated with a fast Fourier transform (FFT) or a lookup table that is programmed with multitone data values. Both of these approaches, however, need relatively large amounts of die area to implement. Therefore, combining a multitone signal generator with a polar transmitter in a circuit design may result in increased costs due to the additional die area requirements.

Another method for creating the multitone signal uses an external signal generator. This method couples the multitone signal through the modulating frequency data input into the polar transmitter. This approach, however, requires that a number of external pins be available in order to couple with the multitone signal. If the polar transmitter is integrated as part of a larger design, then these external pins may burden the design since they may serve no other purpose other than to support testing. Furthermore, if the modulating frequency data is represented digitally, then a plurality of pins may be required to couple the multitone signal to the polar transmitter. As is well-known, adding pins increases the cost of the integrated circuit. Also, if the overall design including the polar transmitter is relatively small, then the integrated circuit package may not be able to support the additional pins needed to couple the multitone signal.

As the foregoing illustrates, what is needed in the art is a method for testing polar transmitters that requires relatively small amounts of area and relatively fewer pins and provides gain and delay information regarding the low and high frequency processing blocks.

SUMMARY OF THE INVENTION

A method and apparatus for testing a polar transmitter uses at least one square wave waveform as test stimuli replacing a multitone waveform. Each square wave signal is coupled one at a time to a frequency modulating input of the polar transmitter. The output of the polar transmitter is analyzed by observing the amplitude and frequency of the demodulated components corresponding to each square wave signal.

DETAILED DESCRIPTION

A method for testing polar transmitters uses a family of square wave signals. Each square wave signal from the family is coupled to the modulating frequency inputs of the polar transmitter and the output is FM demodulated and analyzed. The frequencies of the square wave signals in the family of square wave signals may be chosen such that the fundamental frequency of each square wave is approximately the same as one of the frequencies included in a particular multitone signal. In this manner, the family of square wave signals may produce FM demodulated data similar to a particular multitone signal.

Figure 4A:
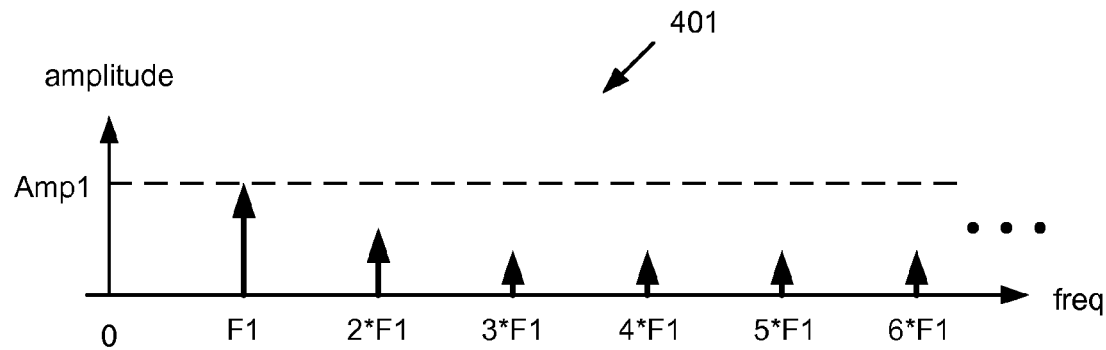
FIGS. 4A-4C are graphs illustrating FM demodulated output data waveforms from a polar transmitter corresponding to three different input signals selected from a family of square wave signals.
Figure 4B:
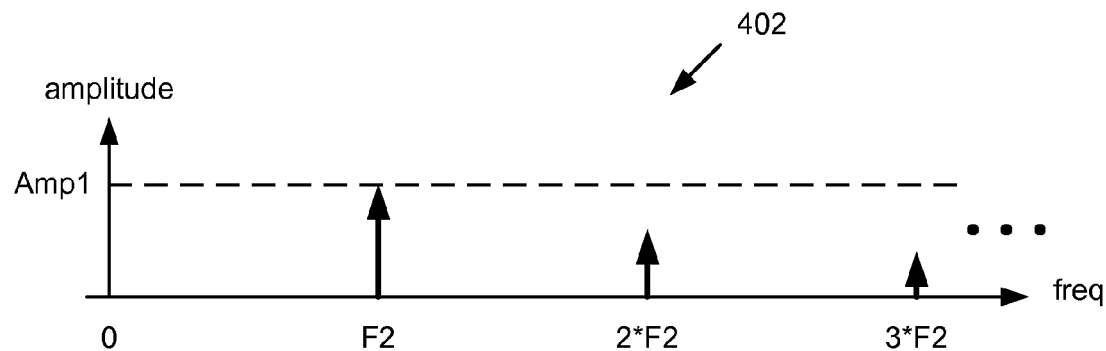
Figure 4C:
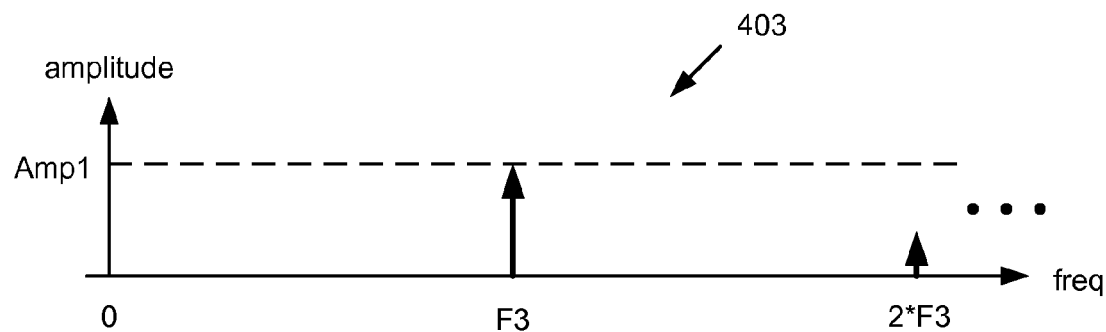

FIGS. 4A-4C are graphs illustrating FM demodulated output data waveforms from a polar transmitter corresponding to three different input signals selected from a family of square wave signals. The family of square wave signals that may include fewer than or more than three square wave signals. Each graph shows the FM demodulated output data corresponding to a square wave signal coupled to the modulating frequency inputs of a polar transmitter.

FIG. 4A shows a first demodulated FM output data waveform 401 corresponding to a first square wave of frequency F1 Hz coupled to the modulating frequency inputs of the polar transmitter. In one embodiment, the frequency F1 Hz may be substantially similar to a first frequency of a sinusoid within a multitone signal. As shown, a first output component in the first demodulated FM output data waveform is located at frequency F1 and has amplitude of Amp1. This first output component of the first demodulated FM output data may be analyzed and compared to the output component at frequency F1 Hz shown in FIG. 3 which may be derived from the multitone signal. FIG. 4A also shows other, high frequency output components, but these are generally lower in amplitude than the component related to the fundamental frequency F1 Hz of the first square wave. As is well-known, these other components are generally located at multiples of the fundamental frequency and are due to the high frequency spectral content of square wave waveforms (e.g. 2*F1, 3*F1, 4*F1, 5*F1, and 6*F1).

Figure 1:
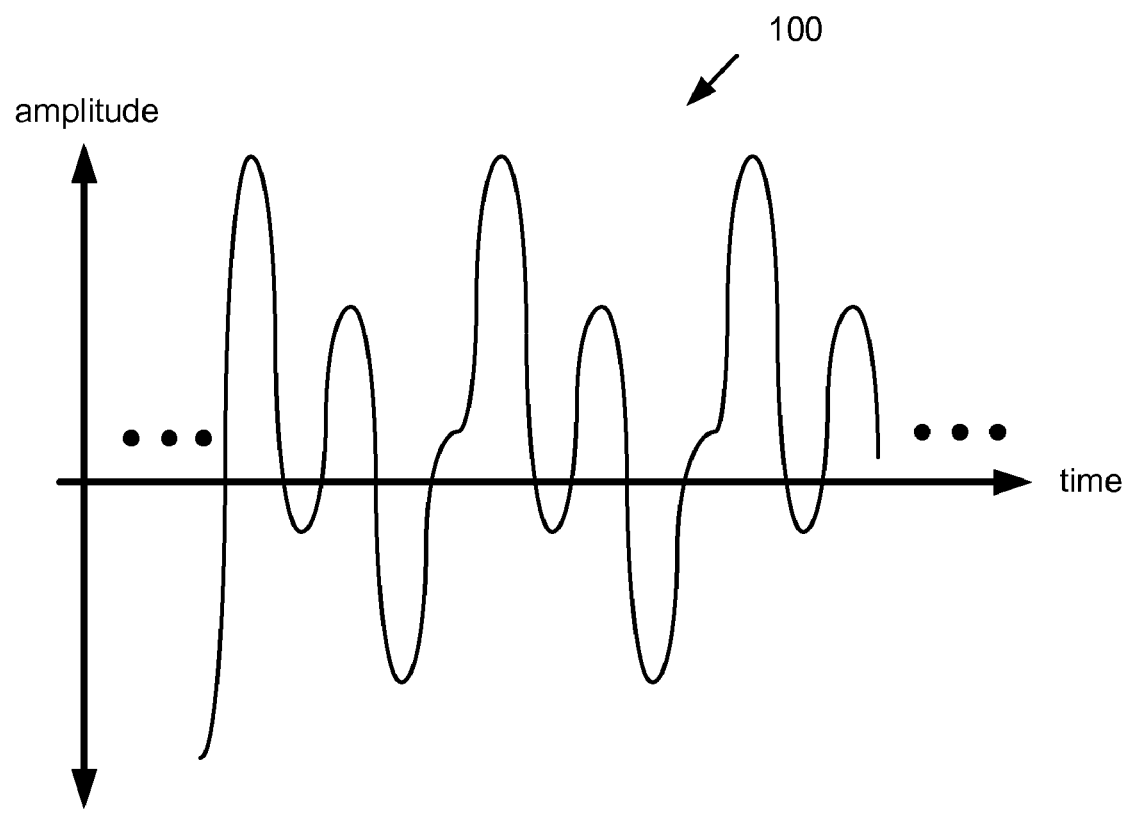
FIG. 1 is a graph of a typical multitone signal that includes three simultaneous frequencies.
Figure 2:
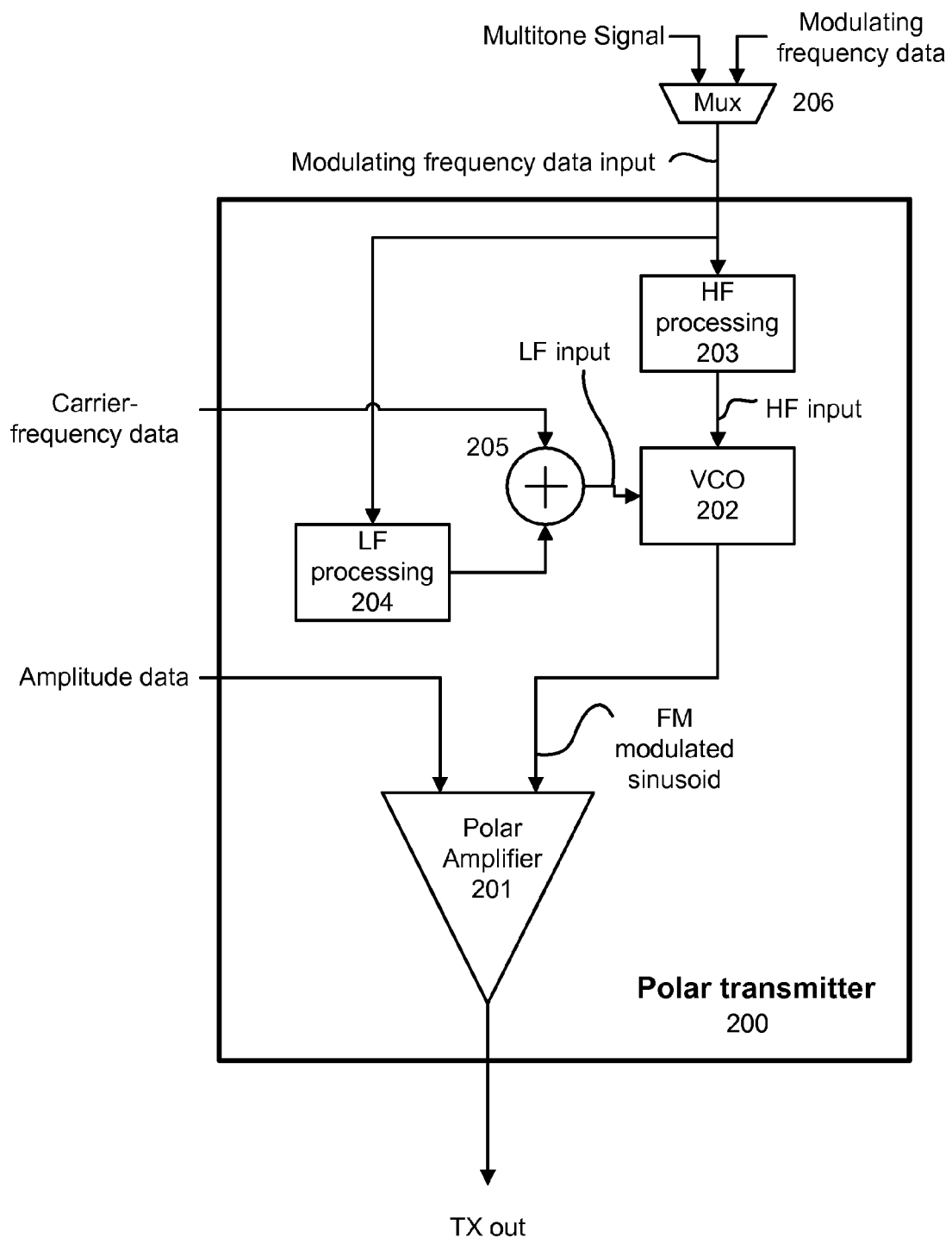
FIG. 2 is a block diagram of a prior art two-point polar transmitter hereinafter referred to as the polar transmitter.
Figure 3:
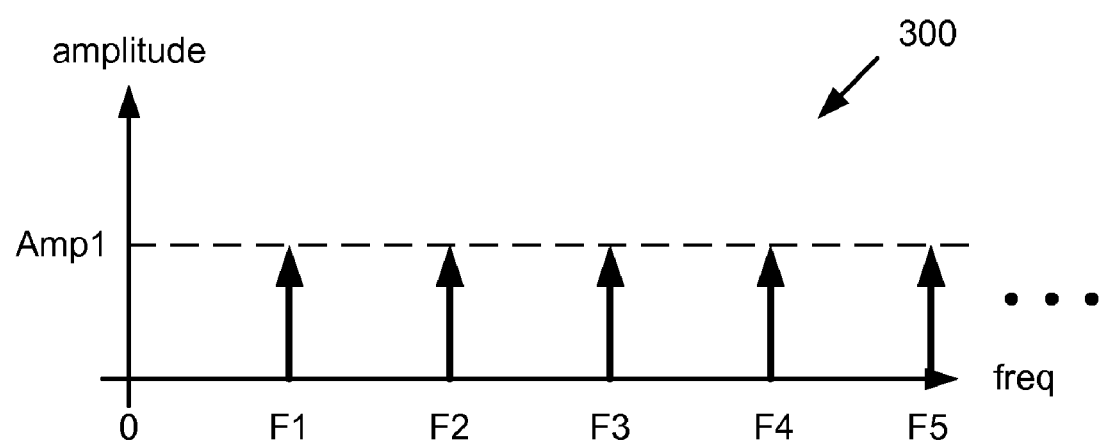
FIG. 3 is a graph of the FM demodulated output of the polar transmitter modulating a multitone signal.

FIG. 4B shows a second demodulated FM output data waveform 402 corresponding to a second square wave of frequency F2 Hz coupled to the modulating frequency inputs of the polar transmitter. In one embodiment, the frequency F2 Hz may be substantially similar to a second frequency included in the multitone signal. As shown in FIG. 4B, a first output component of the second demodulated FM output data waveform has amplitude of Amp1 and is located at frequency F2 Hz. This first output component of the second demodulated FM output data may be analyzed and compared to the output component at frequency F2 Hz as shown in FIG. 3 which may be derived from the multitone signal. Again, FIG. 4B also shows other high frequency output components that may be included in the demodulated output data waveform resulting from the high frequency spectral content of square wave waveforms (e.g. 2*F2 and 3*F2).

FIG. 4C shows a third demodulated FM output data waveform 403 corresponding to a third square wave of frequency F3 Hz coupled to the modulating frequency inputs of the polar transmitter. In one embodiment, the frequency F3 Hz may be substantially similar to a third frequency included in the multitone signal. As shown in FIG. 3C, the first output component of the third demodulated FM output data has amplitude of Amp1 and is located at frequency F3 Hz. This first output component of the third demodulated FM output data may be analyzed and compared to the output component at frequency F3 Hz as shown in FIG. 3. Again, FIG. 4C also shows other high frequency output components that may be included in the demodulated output data waveform resulting from the high frequency spectral content of square wave waveforms (e.g. 2*F3).

A polar transmitter may be tested using a family of square wave signals instead of using a multitone signal. In one embodiment, the fundamental frequency of each square wave signal may be substantially similar to the frequency of one of the simultaneous sinusoids included in the multitone signal. Each square wave from the family of square wave signals may be coupled to the polar transmitter one after another and the demodulated FM output from each square wave signal may be analyzed. If the amplitude or frequency of the first component in the demodulated FM output from the square wave signal appears incorrect, then the gain or delay characteristics of the high frequency of low frequency processing blocks may require adjustment to improve the transmitter output. This step-by-step approach advantageously uses square wave signals to test polar transmitters without the need to use multitone signals.

Square wave signals are relatively easy to create and require a relatively small amount of area in an integrated circuit. Unlike multitone signals which may require an FFT generator or a ROM table, a dedicated square wave generator may be implemented with a relatively simple counter and comparator.

Because the square wave generator uses a relatively small amount of area, the square wave generator may be included in an integrated circuit design with the polar transmitter. This square wave generator advantageously reduces pin requirements since an external multitone signal does not need to be coupled to the polar transmitter. Furthermore, the need for an external multitone signal generator may be obviated.

Figure 5:
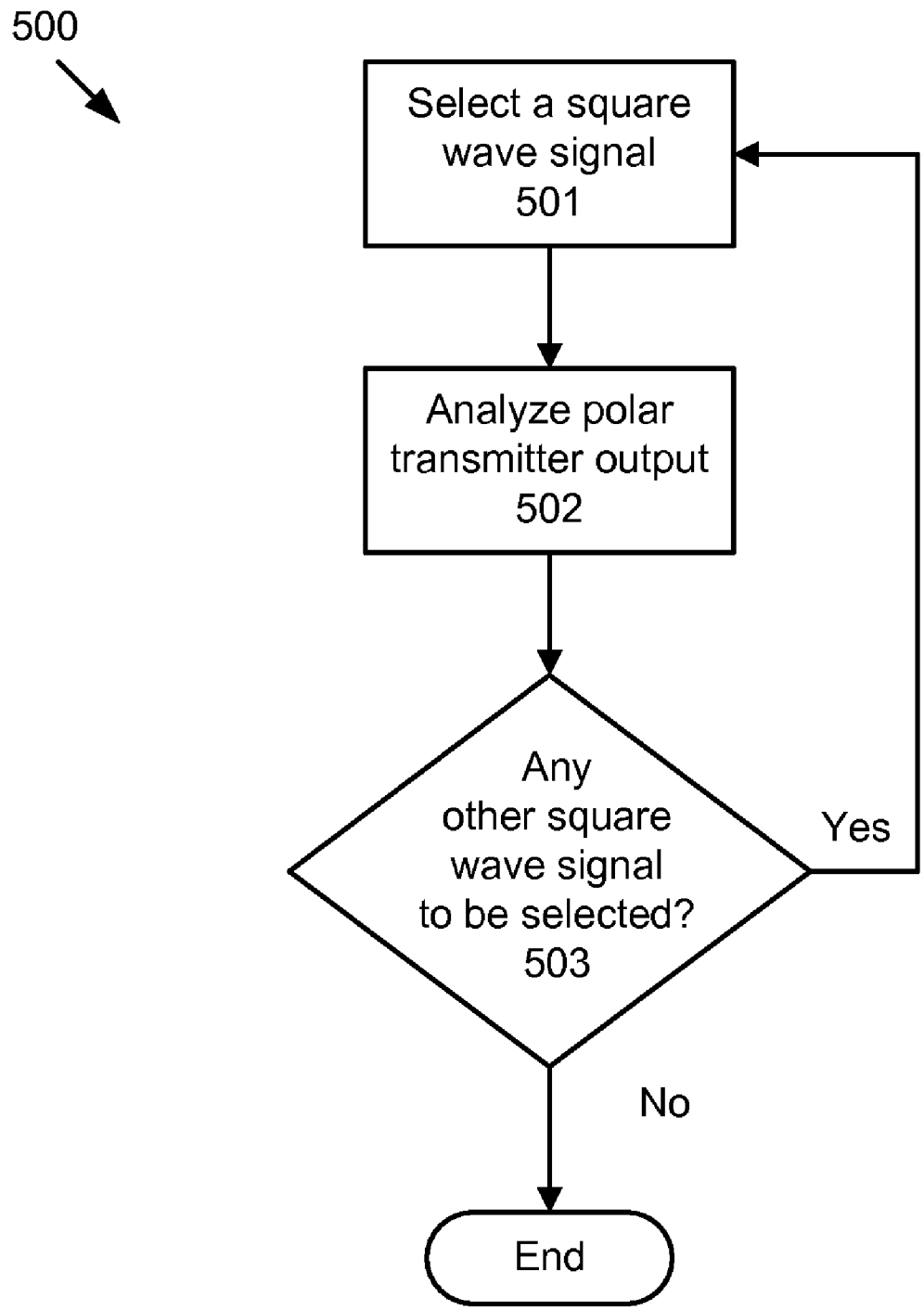
FIG. 5 is a flowchart of method steps for testing polar transmitters with a family of square wave signals.

FIG. 5 is a flowchart of method steps 500 for testing polar transmitters with a family of square wave signals. The method begins by selecting a square wave signal and coupling the square wave signal to the modulating frequency inputs of the polar transmitter in step 501. In step 502, the output of the polar transmitter is analyzed. In step 503, the method determines if any other square wave signal is to be selected. If another square wave signals is to be selected, then the method returns to step 501 and selects another square wave signal. If, on the other hand, no other square wave signals is to be selected, then the method terminates.

In one embodiment, a family of square wave signals can be selected for analysis. For example, the family of square wave signals can be selected when the dynamic range of the analyzer is relatively narrow and the signal-to-noise ratio (SNR) of the transmitter is relatively low. In another embodiment, a single square wave signal can be selected for analysis. This single square wave signal may create enough tones through the band to provide sufficient tuning capability. Notably, the higher frequency harmonics will be smaller than the fundamental harmonic, but by a known amount. If the higher frequency harmonics are not the correct size, then the delays and gains of the polar transistor are not properly tuned. Using a single square wave signal can advantageously reduce overall test time compared to using a family of square wave signals. In one embodiment, a single square wave signal can be selected when the dynamic range of the analyzer is relatively wide and the signal-to-noise ratio (SNR) of the transmitter is relatively high.

Figure 6:
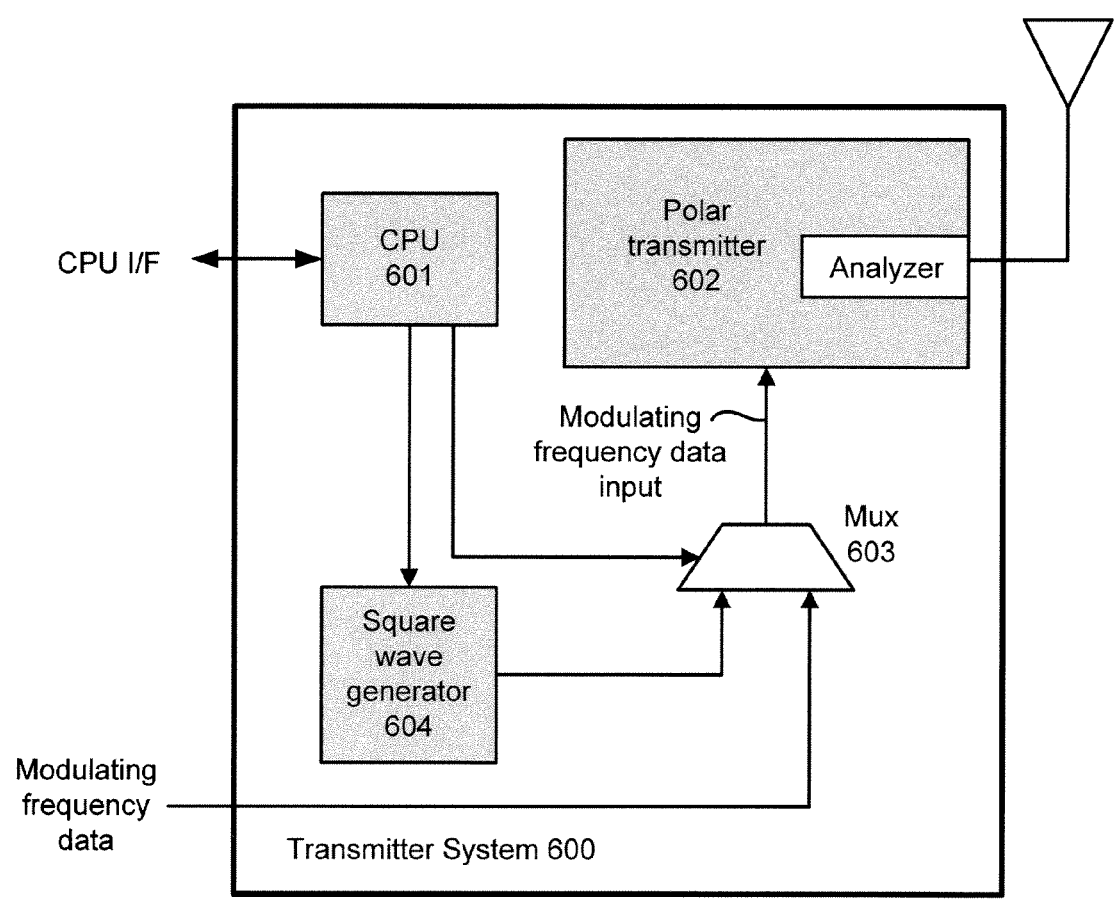
FIG. 6 is a conceptual diagram of a transmitter system that may be configured to implement one or more aspects described in the specification.

FIG. 6 is a conceptual diagram of a transmitter system 600 that may be configured to implement one or more aspects described in the specification. The transmitter system may include, without limitation, a central processing unit 601 (CPU), a polar transmitter 602, a mux 603, and a square wave generator 604. The CPU 601 is coupled to the mux 603, and the square wave generator 604. In other embodiments, the CPU 601 may be external to the transmitter system 600 but still may couple to the elements within.

The CPU 601 may configure the square wave generator 604 to generate a square wave signal from a family of square waves. The square wave generator 604 and modulating frequency data signal is coupled to the mux 603. In order to test the polar transmitter 602, the CPU 601 configures the mux 603 to couple the output of the square wave generator 604 to the modulating frequency input of the polar transmitter 602. The output of the polar transmitter 602 may be analyzed as described in greater detail above. The user may adjust the polar transmitter 602 by issuing commands to the CPU 601 through the CPU interface (CPU I/F).

Although illustrative embodiments of the invention have been described in detail herein with reference to the accompanying figures, it is to be understood that the invention is not limited to those precise embodiment. They are not intended to be exhaustive or to limit the invention to the precise forms disclosed. As such, many modifications and variations will be apparent. Accordingly, it is intended that the scope of the invention be defined by the following Claims and their equivalents.

The invention claimed is:

1. A method of testing a polar transmitter, the method comprising:
   providing at least one square wave waveform as test stimuli;
   coupling each square wave signal to a frequency modulating input of the polar transmitter; and
   analyzing an output of the polar transmitter by observing an amplitude and a frequency of demodulated components corresponding to each square wave signal, wherein a fundamental frequency of each square wave signal is approximately equal to one frequency of a predetermined multitone signal.

2. A transmitter system comprising:
   a polar transmitter;
   a square wave generator configured to generate square wave signals, wherein a fundamental frequency of each square wave signal is approximately equal to one frequency of a predetermined multitone signal; and
   a multiplexer for selectively providing one of an output of the square wave generator and modulating frequency data to the polar transmitter.

3. The transmitter system of claim 2, further including a central processing unit for, during a test mode, configuring the square wave generator to generate each square wave signal from a family of square waves and configuring the multiplexer to couple the output of the square wave generator to the polar transmitter.

* * * * *